United States Patent
Ding

(10) Patent No.: US 6,687,723 B1
(45) Date of Patent: Feb. 3, 2004

(54) TRI-MODE ADAPTIVE FILTER AND METHOD

(75) Inventor: Heping Ding, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 505 days.

(21) Appl. No.: 09/718,391

(22) Filed: Nov. 24, 2000

(51) Int. Cl.$^7$ .............................................. G06F 17/10
(52) U.S. Cl. ..................................................... 708/322
(58) Field of Search ........................................ 708/322

(56) References Cited

U.S. PATENT DOCUMENTS

| | | | |
|---|---|---|---|
| 5,428,562 A | 6/1995 | Gay | 364/724.19 |
| 5,745,564 A * | 4/1998 | Meek | 379/406.08 |
| 6,141,378 A * | 10/2000 | d'Oreye de Lantremange | 375/232 |
| 6,185,300 B1 * | 2/2001 | Romesburg | 379/406.09 |
| 6,212,273 B1 * | 4/2001 | Hemkumar et al. | 379/406.08 |

OTHER PUBLICATIONS

"The Fast Affine Projection Algorithm", Gay, S.L., et al., Proceedings of International Conference on Acoustics, Speech and signal Processing, Detroit, Michigan, USA, May 1995, pp. 3023–3026.

"Acoustic–Echo Cancellation Software for Hands–Free Wireless Systems", Application Report of Texas Instruments, Digital Signal Processing Solutions, SPRA 162, Jul. 1997, pp. 3–7.

* cited by examiner

*Primary Examiner*—David H. Malzahn
(74) *Attorney, Agent, or Firm*—Angela C. de Wilton

(57) ABSTRACT

An adaptive filter having a hybrid structure and capable of operating in a tri-mode regime is disclosed. The tri-mode adaptive filter includes three sub-filters which operate in a fast convergence mode, a slow convergence mode, and a freezing mode respectively. The adaptive filter further comprises a quality detector which measures non-convergence and a near-end signal of the tri-mode filter and generates a feedback signal which is sent to a switching means. In response to the feedback signal, the switching means provides switching between the sub-filters so that one of the sub-filters operates at a time, providing adaptive filtering in accordance with its corresponding filtering method. In the embodiment of the invention the sub-filters operating in fast, slow and freezing mode are represented by Conjugate Gradient Fast Affine Projection (CGFAP) adaptive filter, Normalized Least Mean Square (NLMS) adaptive filter and Freezing adaptive filter respectively, wherein the Freezing filter operates with constant adaptive filter coefficients, i.e. without updating the filter coefficients, thereby providing convolution without adaptation. Corresponding method of adaptive filtering is also provided.

33 Claims, 5 Drawing Sheets

TRI-MODE ADAPTIVE FILTER AND METHOD

FIELD OF INVENTION

The invention relates to an adaptive filter, and in particular, to the adaptive filter having a hybrid structure and providing a tri-mode operation.

BACKGROUND OF THE INVENTION

Adaptive filtering is a digital signal processing technique that has been widely used in numerous signal processing applications such as echo cancellation, noise cancellation, channel equalization and system identification. Characteristics of an adaptive filter are largely determined by its adaptation algorithm, and the choice of the adaptation algorithm in a specific adaptive filtering system directly affects the performance of the system.

Being simple and easily stable, the normalized least mean square (NLMS) adaptation algorithm is now widely used in the industry with a certain degree of success. However, because of its intrinsic weakness, this algorithm converges slowly, especially with colored training signals, e.g. speech signals. As a result, the performance of systems incorporating NLMS adaptive filters often suffers from the slow convergence nature of the algorithm.

To solve the problem of slow convergence, it has been proposed to use a modification of an Affine Projection algorithm which is known as Fast Affine Projection (FAP) algorithm, see e.g. publication by Steven L. Gay and Sanjeev Tavathia (Acoustic Research Department, AT&T Bell Laboratories), "The Fast Affine Projection Algorithm," pp. 3023–3026, Proceedings of the International Conference on Acoustics, Speech, and Signal Processing, May 1995, Detroit, Mich., U.S.A. and U.S. Pat. No. #5,428,562 to Gay. The FAP converges several times faster than NLMS, with only a marginal increase in implementation complexity. However, a stability issue has been preventing FAP from being used in the industry.

A remedy for the instability problem associated with the FAP algorithm has been proposed in two U.S. patent applications to Heping Ding Ser. Nos. 09/218,428 and 09/356,041 filed Dec. 22, 1998 and Jul. 16, 1999 respectively, wherein a new Stable FAP (SFAP) filter and method have been invented. The cited patent applications are incorporated herein by reference. The SFAP filter solves the instability problem of FAP caused by error accumulation in an inversion process of an auto-correlation matrix while providing the advantages of other known methods.

Although the development of fast convergence adaptive methods may be considered as a giant leap forward, there is still a problem remaining which is common to all existing adaptive filters while most severely influencing the performance of the fast convergence adaptive filters. The problem is that the adaptive filter performs satisfactory only in the absence of the near-end signal or when the near end signal is negligibly small.

To describe this problem in more detail, let us refer to FIG. 1, which illustrates a typical echo-cancellation system 10 with an embedded adaptive filter 100. A digitally sampled far-end reference input signal x(n) is supplied to the adaptive filter 100 and to an echo path 14 producing an unwanted signal u(n), the signal being an echo of the input signal x(n) through the echo path 14. The unwanted signal u(n) is mixed up with the wanted near-end signal s(n) in a summer 16 to produce a response signal d(n). The response signal d(n) is sent to another summer 18 together with an echo estimate signal y(n) generated by the adaptive filter 100. The summer 18 subtracts y(n) from d(n) producing an output signal e(n) to be transmitted to the far-end. The echo path 14 can be constantly changing, and the adaptive filter 100 must continuously adapt to the new echo path. Therefore the echo estimate signal y(n) must be as close to u(n) as possible, so that the latter is largely cancelled by the former to ensure that e(n) best resembles s(n). The output signal e(n), called the error signal, is then transmitted to the far-end and at the same time sent to the adaptive filter 100 which uses the signal to adjust the filter coefficients.

If the near-end signal s(n) is not small enough to ensure that the response signal d(n) is purely an echo signal u(n), the response signal d(n) contains components of the near end signal s(n) which can be short-term correlated with x(n). This is because both x(n) and s(n) are speech signals, which often show short-term correlations with each other even if they come from different sources. As a result, the adaptive filter 100 may mis-converge, and the near-end signal s(n) component in e(n) may be distorted, because the adaptive filter attempts to track and cancel components in the near-end signal s(n) that are short-term correlated to the input far-end signal x(n). The faster the convergence of the adaptive filter's adaptation algorithm, the stronger the influence of the near end signal s(n) on the performance of the filter operation, causing the filter to mis-converge and to distort the near-end signal itself in the output e(n).

Accordingly, there is a need for development of an adaptive filter and method which would provide high performance operation in the presence of the near-end signal.

SUMMARY OF THE INVENTION

It is therefore an object of the invention to provide an adaptive filter and a method of adaptive filtering which would avoid the afore-mentioned problems.

According to one aspect of the present invention there is provided a method of adaptive filtering, comprising the steps of:

providing operation of an adaptive filter in one of the three modes, the modes being a fast converging mode, a slow converging mode and a freezing mode;

measuring non-convergence of the filter and a near-end signal, and generating a feedback signal based on the measurements; and switching between the modes of operation of the filter in response to the feedback signal.

Convenietly, the step of measuring non-convergence and near-end signal comprises comparing the measured values with predetermined threshold values for non-convergence and near end signals respectively.

The step of switching between the modes of operation of the filter comprises switching the adaptive filter to the freezing mode when the near-end signal is above the corresponding threshold value, and non-convergence is below the corresponding threshold value. Alternatively, when non-convergence is above the threshold value and the near-end signal is below the threshold value, the filter is switched to the fast converging mode. Yet alternatively, when non-convergence and near-end signal are both below the corresponding threshold values, the adaptive filter is switched to the slow converging mode. When the non-convergence and near-end signal are both above the corresponding threshold values, the filter may be switched to either one of the three modes depending on the system requirements.

Advantageously, operation of the adaptive filter in the slow converging mode comprises adaptive filtering in accordance with a normalized least mean square (NLMS) method, and operation of the filter in the fast converging mode comprises providing adaptive filtering in accordance with a fast affine projection (FAP) method or Stable fast affine projection method (SFAP). Beneficially, the adaptive filtering in accordance with the SFAP method comprises using a steepest descent method or a conjugate gradient method.

According to another aspect of the invention there is provided a method of adaptive filtering, comprising the steps of:

(a) providing initial adaptive filtering for an incoming signal by one of adaptive filtering methods;

(b) measuring non-convergence of the adaptive filtering method and a near-end signal;

(c) comparing the measured values of the non-convergence and near-end signal with pre-determined threshold values;

(d) when the near-end signal is above the corresponding threshold value and non-convergence is below the corresponding threshold value, freezing coefficients in the currently used adaptive filtering method;

(e) when non-convergence is above the corresponding threshold value and the near-end signal is below the corresponding threshold value, providing adaptive filtering in accordance with a fast converging adaptive filtering method;

(f) when non-convergence and near-end signal are both below the corresponding threshold values, providing adaptive filtering in accordance with a slow converging adaptive filtering method; and (g) repeating the steps (b) to (f) required number of times.

The method may comprise an additional step of providing adaptive filtering in accordance with my one of the three adaptive modes, a fast converging mode, a slow converging mode, or freezing mode, when the non-convergence and near-end signal are both above the corresponding threshold values, the step being performed before the step (g). In the freezing mode, the adaptive filter coefficients are not being updated, i.e. frozen, and the filter performs convolution only without adaptation.

Advantageously, the step of providing adaptive filtering in accordance with the slow converging adaptive filtering method comprises providing adaptive filtering in accordance with a normalized least mean square (NLMS) method, and the step of providing adaptive filtering in accordance with the fast converging adaptive filtering method comprises providing adaptive filtering in accordance with fast affine projection (FAP) method or stable fast affine projection (SFAP) method. Beneficially, the adaptive filtering in accordance with the SFAP method comprises using a conjugate gradient method. Alternatively, the adaptive filtering in accordance with the SFAP method may comprise using a steepest descent method.

According to yet another aspect of the invention there is provided an adaptive filter, comprising:

means for providing operation of the adaptive filter in one of the three modes, the modes including fast converging mode, slow converging mode and a freezing mode;

means for measuring non-convergence of the filter and a near-end signal, and generating a feedback signal; and means for switching between the modes of operation of the filter in response to the feedback signal.

Conveniently, the means for providing operation of the adaptive filter in one of the three modes comprises first, second and third sub-filters which operate in fast converging mode, slow converging mode, and freezing mode respectively. Means for measuring non-convergence and near-end signal comprises a quality detector which identifies presence of non-convergence (NC) and near-end signal (NS), distinguishes between them and compares the measured values with pre-determined threshold values.

Advantageously, the first sub-filter comprises a fast affine projection (FAP) filter or a stable fast affine projection filter (SFAP), the SFAP filter including one of the steepest descent and conjugate gradient calculator, operating in accordance with the steepest descent and conjugate gradient methods respectively.

Beneficially, the second sub-filter comprises a normalized least mean square (NLMS) filter, and the third sub-filter comprises a filter which operates without updating the filter coefficients, thereby providing convolution only.

The adaptive filter and method described above have an advantage over known adaptive filters by providing quality operation in the presence of the near-end signal and combining advantages of existing adaptive filtering techniques while avoiding their shortcomings.

BRIEF DESCRIPTION OF THE DRAWINGS

The invention will now be described in greater detail regarding the attached drawings in which.

DETAILED DESCRIPTION OF THE PREFERRED EMBODIMENT

Figure 1:
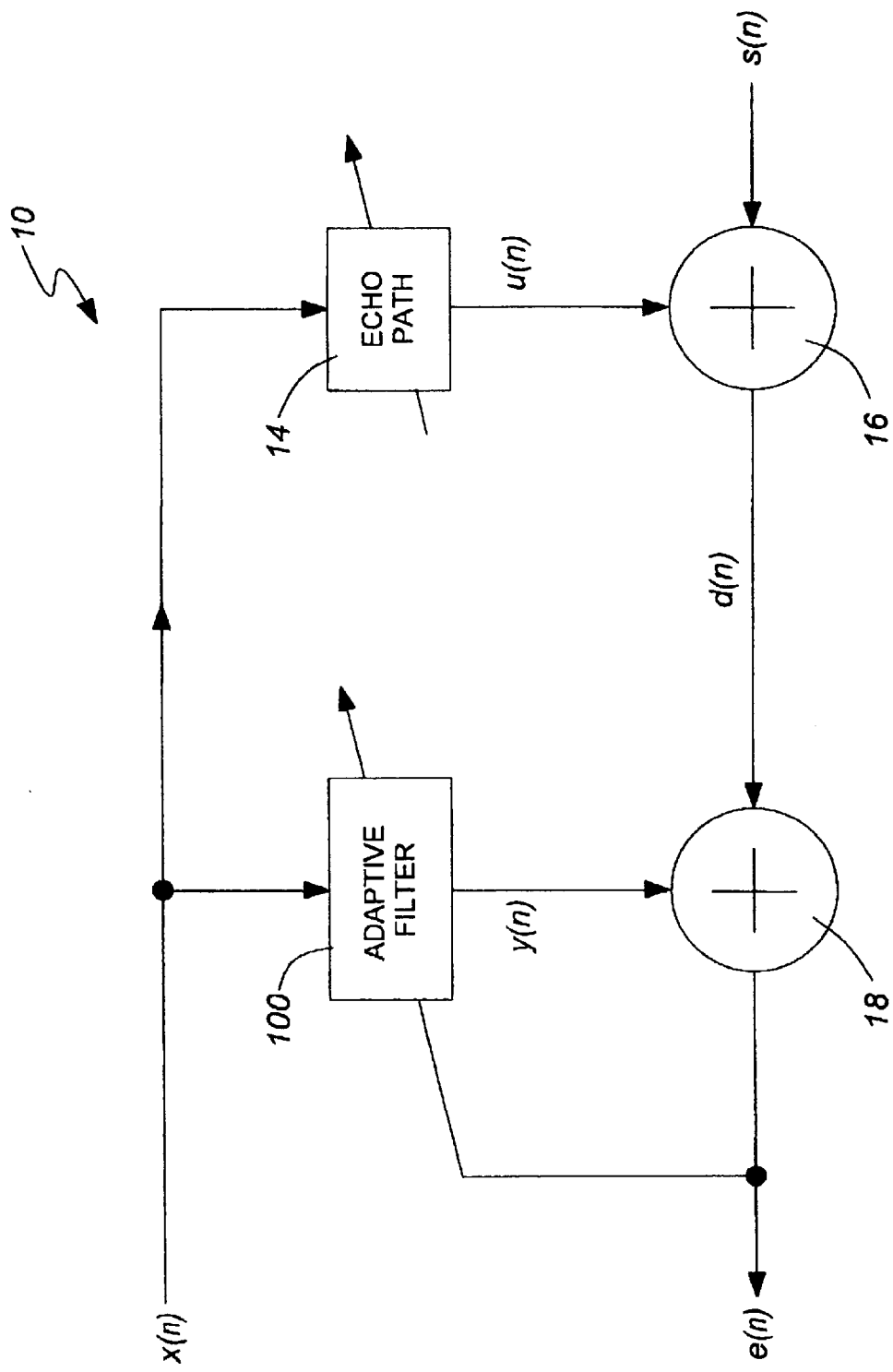
FIG. 1 is a block diagram of a typical echo cancellation system.
Figure 2:
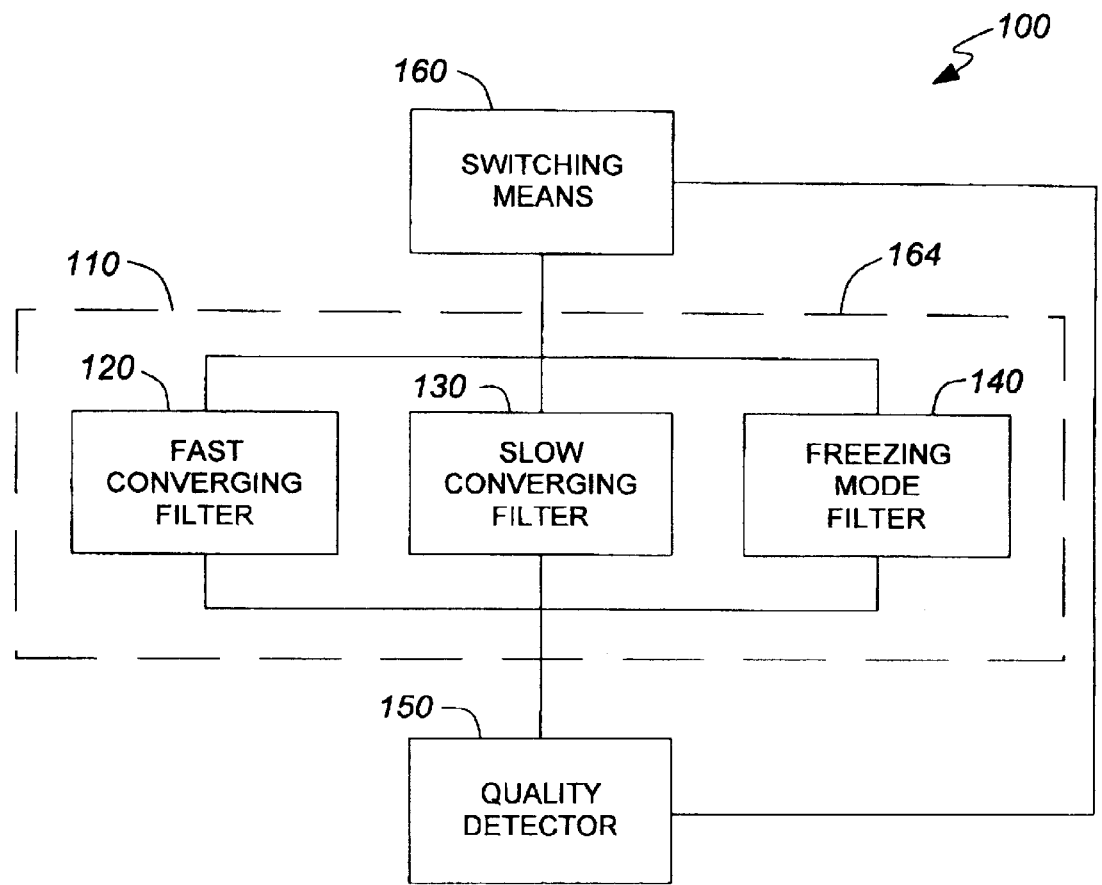
FIG. 2 is a block diagram of an adaptive filter according to an embodiment of the invention.

A block diagram of the adaptive filter 100 according to the embodiment of the invention is shown in FIG. 2. The filter 100 has a hybrid structure and comprises a tri-mode filter 110, including first, second and third sub-filters 120, 130 and 140, operating in fast convergence mode, slow convergence mode and freezing mode respectively. The adaptive filter 100 further comprises a quality detector 150 and a switching means 160. The quality detector 150 provides measurement of non-convergence (NC) and near-end signal (NS) of the tri-mode filter 110 and generates a feedback signal 164 which is sent to the switching means 160. In response to the feedback signal 164, the switching means 160 provides switching between the sub-filters 120, 130 and 140 so that one of the sub-filters operates at a time and provides adaptive filtering for the tri-mode filter 110 in accordance with its corresponding filtering method. In the embodiment of the invention the sub-filters 120, 130 and 140 are represented by Stable Fast Affine Projection (SFAP) adaptive filter, Normalized Least Mean Square (NLMS) adaptive filter and Freezing adaptive filter respectively. SFAP and NLMS filters 120 and 130 correspondingly comprise conjugate gradient and NLMS calculators which operate in accordance with a Conjugate Gradient Fast Affine Projection (CGFAP) and NLMS adaptive filtering methods respectively, whereby the Freezing filter 140 provides adaptive filtering without updating adaptive filter coefficients, thereby providing convolution without adaptation.

The NLMS adaptive filter is well-known and widely used in industry. The detailed description of NLMS filter and method can be found, e.g. in "Acoustic-Echo Cancellation Software for Hands-Free Wireless Systems", Application Report of Texas Instruments, Digital Signal Processing Solutions, SPRA 162, July 1997, pp. 3–7.

The CGFAP filter solves a problem of instability associated with the FAP adaptive filter caused by error accumulation in an inversion process of an auto-correlation matrix as described in patent applications to Heping Ding cited above. The CGFAP adaptive filter provides updating of the adaptive filter coefficients by solving at least one system of linear equations, whose coefficients are auto-correlation matrix coefficients, by using conjugate gradient descending iterative method. In a simplified model of CGFAP when a normalized step size is close to unity, the method allows to reduce a problem of the matrix inversion used in FAP to solving a system of linear equations whose solution coincides with a first column of the inverse auto-correlation matrix. Due to the inherent stability of descending iterative methods, inevitable numerical errors are not accumulated, being corrected as the process goes on. The detailed description of CGFAP filter and method can be found in the two patent applications to Heping Ding cited above.

Figure 3:
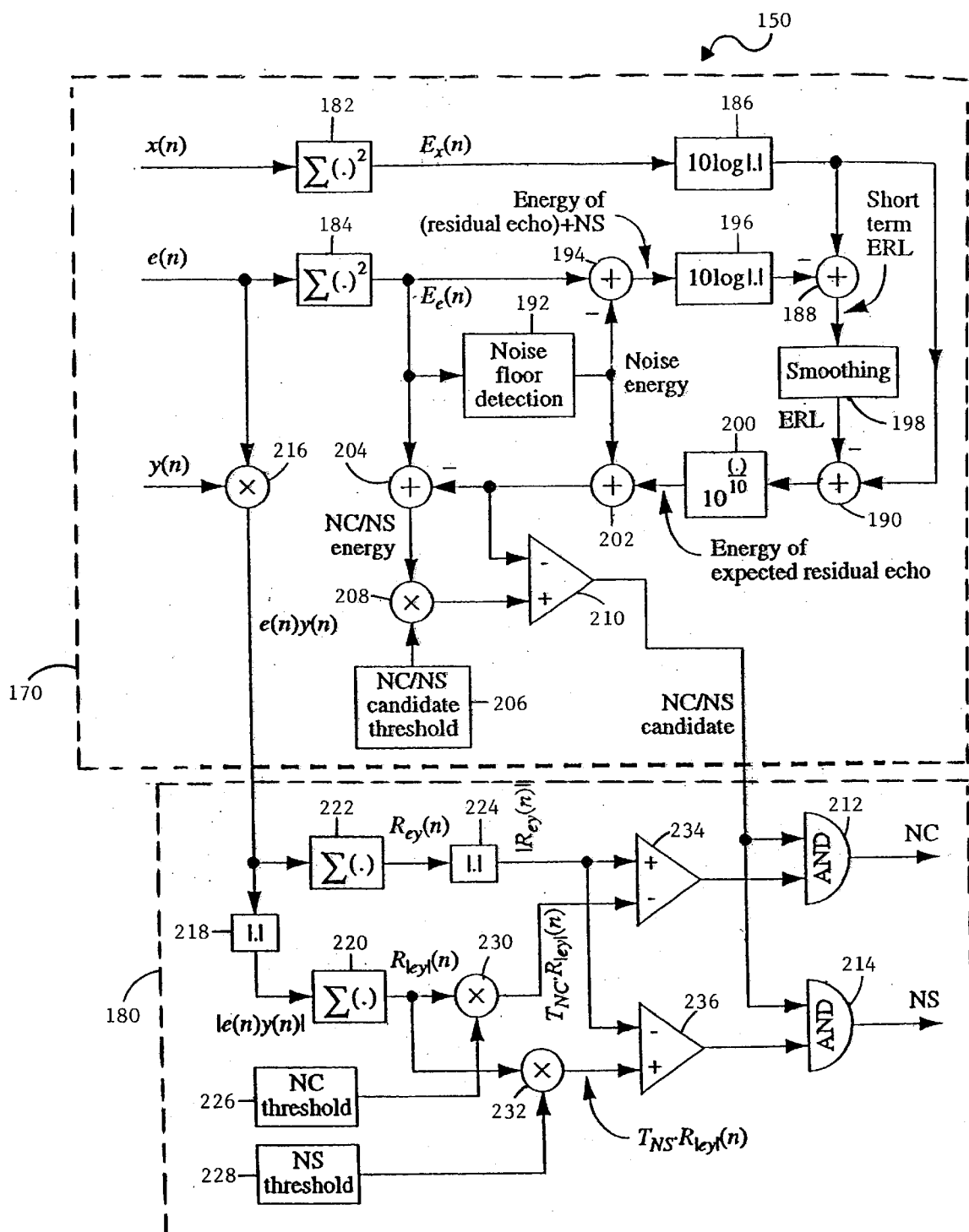
FIG. 3 is a block diagram of the quality detector incorporated into the adaptive filter of FIG. 2.

The block diagram of the quality detector 150 is shown in FIG. 3. It includes first and second stages 170 and 180, the first stage being an NC/NS candidate detector stage 170 and the second stage being an NCINS distinguisher stage 180. The purpose of the first stage 170 is to identify the presence of non-convergence or near-end signal and to supply the results to the second stage 180 to distinguish between the two of them.

The first stage 170 receives the reference input signal x(n) and the output error signal e(n) and calculates corresponding short-term energies of the signals (blocks 182 and 184). The energies are determined by calculating sums of squares of the input samples over a certain time interval. The summation can be weighted, e.g.

$$E_x(n) = \sum_{m=0}^{\infty} \beta^m x^2(n-m) \quad \text{(Equation 1)}$$

$$E_e(n) = \sum_{m=0}^{\infty} \beta^m e^2(n-m) \quad \text{(Equation 2)}$$

where β is a positive constant which is less than and close to unity. The symbols within boxes 182 and 184 mean "average of squares over time" which are calculated according to equations (1) and (2) shown above.

Next, the calculated input signal energy $E_x(n)$ is converted into a logarithmic decibel (dB) domain in a dB converter 186 and simultaneously sent to summers 188 and 190. At the same time the calculated error signal energy $E_e(n)$ which contains some noise, residual echo and near-end signal is put through a noise floor detector 192 to identify noise components in $E_e(n)$. The noise components are subtracted from $E_e(n)$ in subtractor 194, and the resulted noise free error signal energy is converted into logarithmic decibel (dB) domain in a dB converter 196. The converted noise free error signal energy is sent to the subtractor 188 where the converted input signal energy signal from the converter 186 is also being sent as described above. The subtractor determines the difference between the two decibel energy signals, the difference being referred to as the short-term echo return loss (ERL) signal. From a physical point of view, the higher the ERL, the better the performance of the adaptive filter, because more loss to the echo is obtained. In order to avoid its short term fluctuations, the short term ERL signal is filtered in a smoothing filter 198 which provides averaging of the short-term ERL signal over a longer time interval. The smoothened ERL signal is subtracted from the reference input signal energy $E_x(n)$ in subtractor 190 which provides a dB value of the expected energy of residual echo as its output. Converter 200 converts the expected residual echo energy from 190 back into the linear energy domain and mixes it up with the noise energy in summer 202. The output from summer 202 is subtracted from the error energy signal $E_e(n)$ in subtractor 204 whose output, being an energy signal, is a potential candidate for non-convergence or near-end signal of the filter. To identify whether this energy signal is significant, the 204 output is multiplied with an NC/NS threshold 206 in multiplier 208 and the product is compared with the output from summer 202 in a comparator 210. The output of the comparator 210 is unity if the incoming positive signal (output from multiplier 208) is greater than the incoming negative signals (output from summer 202). Otherwise, the output of the comparator 210 is zero.

If the output of the comparator 210 is zero, then logic gates 212 and 214 are closed, and there is no non-convergence or near-end signal, i.e. NC, NS signals are not generated.

If the output of the comparator 210 is unity, there is a need to distinguish between the NC and NS signals, the task which is performed by the second stage 180 of the quality detector 150. The method of distinguishing is based on an orthogonality criterion where orthogonal properties between e(n) and y(n) are used. The error signal e(n) is multiplied with an echo estimate signal y(n) in a multiplier 216, and an absolute value of the product is determined in an absolute value calculator 218. Then a cross correlation between e(n) and y(n) is determined along with a sum of absolute values of their product as shown in Equations (3) and (4) below:

$$R_{ey}(n) = \sum_{m=0}^{\infty} \beta^m e(n-m)y(n-m) \quad \text{(Equation 3)}$$

$$R_{|ey|}(n) = \sum_{m=0}^{\infty} \beta^m |e(n-m)y(n-m)| \quad \text{(Equation 4)}$$

wherein β is a positive number that is less than and close to unity.

The physical meaning of the result of equation (4) is time average of the absolute values of the product |e(n)y(n)| which is calculated in time average calculator 220. It gives a maximum possible value for the time average product of e(n)y(n). Cross correlation between e(n) and y(n) in accordance with equation (3) is determined in a time average calculator 222, the absolute value of the above cross correlation being determined in an absolute value calculator 224. Corresponding stored threshold values 226 and 228 for non-convergence and near-end signal signals are fed to multipliers 230 and 232 to calculate input signals for comparators 234 and 236 as shown in FIG. 3. The second incoming signal for both comparators 234 and 236 is the output signal from the absolute value calculator 224 which is the absolute value of the cross correlation signal. The output signals from comparators 234 and 236 serve as input signals to the logic gates 212 and 214 respectively, the other signal to the gates being an NC/NS candidate signal from the comparator 210. If the gate 212 is open, it is an indication of a non-convergence of the adaptive filter, while the fact that the gate 214 is open indicates that the near-end signal of the filter takes place.

In summary, the quality detector 150 provides monitoring of quality of operation of the adaptive filter 100 and distinguishes between the causes of non-performance of the filter due to non-convergence and presence of the near-end signal.

Thus, the adaptive filter 100 including the tri-mode filter 110 and providing tri-mode operation has been provided.

Figure 4:
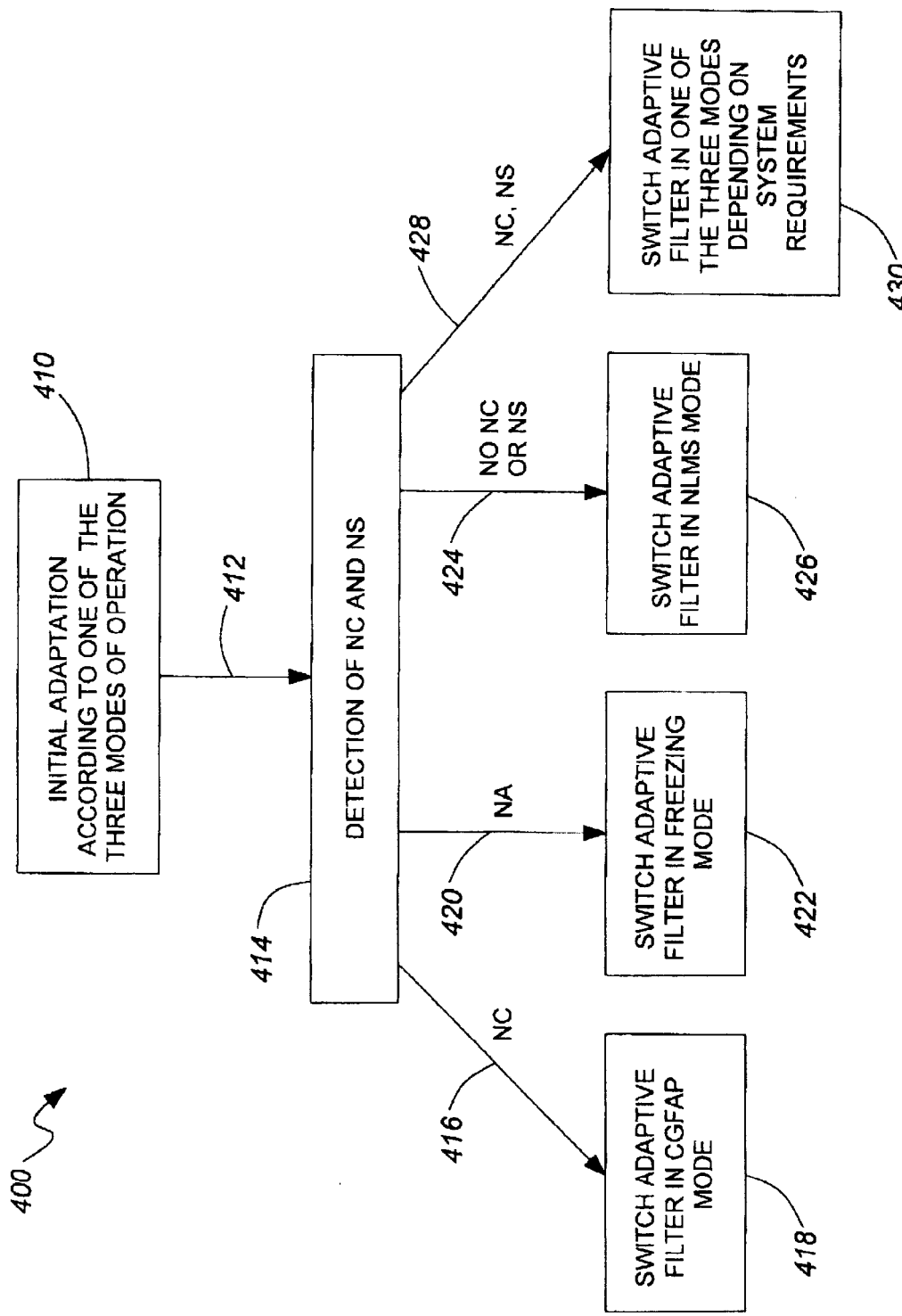
FIG. 4 is a flowchart illustrating a method of adaptive filtering for the adaptive filter of FIG. 2.

The adaptive filter 100 operates in the following manner as illustrated by flowchart 400 in FIG. 4.

Initially, the adaptive filter provides adaptation in accordance with one of the three adaptation methods implemented in the first, second or third sub-filters (box 410). The be data from the adaptive filter is fed to the quality detector 150 (routine 412) to provide detection of non-convergence (NC) and near-end signal (NS) of the filter and to distinguish between the two of them (box 414), the detection process including comparison of NC and NS with corresponding threshold values. Depending on the output of the quality detector, a feedback signal is sent to the switching means (not shown in FIG. 4) to provide switching between the three sub-filters to use different adaptation methods under different conditions as will be described in detail below.

When non-convergence of the filter is above the threshold value and the near-end signal is below its threshold value, the adaptive filter is switched in the fast converging mode, wherein adaptation is provided in the first sub-filter in accordance with CGFAP method (routine 416 and box 418). This situation occurs when there is an initial non-convergence of the filter or the echo path changes rapidly requiring switching to CGFAP to provide fast convergence of the adaptive filter.

When the near-end signal is above the threshold value and non-convergence is below its threshold value, the adaptive filter is switched in the freezing mode, wherein the third sub-filter provides convolution without adaptation (routine 420 and box 422). As a result the filter eliminates mis-convergence and does not cause distortion of the near-end signal component in e(n).

When non-convergence and near-end signal are both below the corresponding threshold values, the adaptive filter is switched in the slow converging mode, wherein adaptation is provided in accordance with NLMS method in the second sub-filter (routine 424 and box 426). In this mode the adaptive filter remains converged in a steady state and can adapt to small echo path variations.

When non-convergence and near-end signal are both above corresponding threshold values, the adaptive filter can operate in one of the three modes, depending on the system requirements (routine 428, box 430).

Note that when the adaptive filter is switched between the modes of operation, the successor mode takes the coefficient values left by the predecessor mode as a starting point and provides further adaptation and convolution. Conveniently, such a tri-mode adaptive filter is not expensive to implement because NLMS is a sub-set of CGFAP and therefore most of the code and memory usage by the NLMS is shared with that of the CGFAP.

A real-time prototype implementing the tri-mode adaptive filter has been developed in the Nortel Networks laboratories. Running on a Texas Instruments' TMS320C54x DSP in a hands free IP phone platform, the prototype uses CGFAP adaptive method, NLMS as a sub-set of CGFAP, and the non-convergence and near-end signal detection scheme described above. In addition, the results of computer simulation are presented in a time diagram of FIG. 5 wherein the adaptive filter has been chosen to have the following parameters: affine projection order $N_{FAP}=5$, length of adaptive filter $L_{AF}=512$, length of the simulated echo path L=1200. The first two horizontal waveforms on the diagram denoted by letters A and B illustrate the time waveform of the response signal d(n) and the error signal e(n) respectively, while the third and fourth waveforms down denoted by letter C and D respectively illustrate non-convergence (NC) and near-end signal (NS) flags, respectively. NC and NS flags are binary signals which are equal to unity when the corresponding activities of the filter take place and equal to zero otherwise, e.g. NC=1 when non-convergence is detected and NS=1 when a near-end signal is detected, otherwise NC=0 and NS=0. The next waveform down denoted by letter E on the diagram refers to a filter mode control flag, the flag being a ternary signal which has three different values for different adaptation methods being used (SFAP, NLMS and Freezing mode), e.g. the flag equals zero when the third sub-filter utilizing the freezing mode is being used, equals unity when NLMS mode is being used and equals two when SFAP method is being used. The control flag is generated by the quality detector 150 and sent to the switching means 160. The last waveform on the diagram denoted by letter F illustrates the error signal e(n) combined with the NS flag to provide a filtered e(n) signal, namely, when NS=1 the filtered signal equals e(n), while for NS=0 the filtered signal equals zero. Accordingly in the filtered e(n) signal, variations of e(n) due to echo path changes are eliminated.

Figure 5:
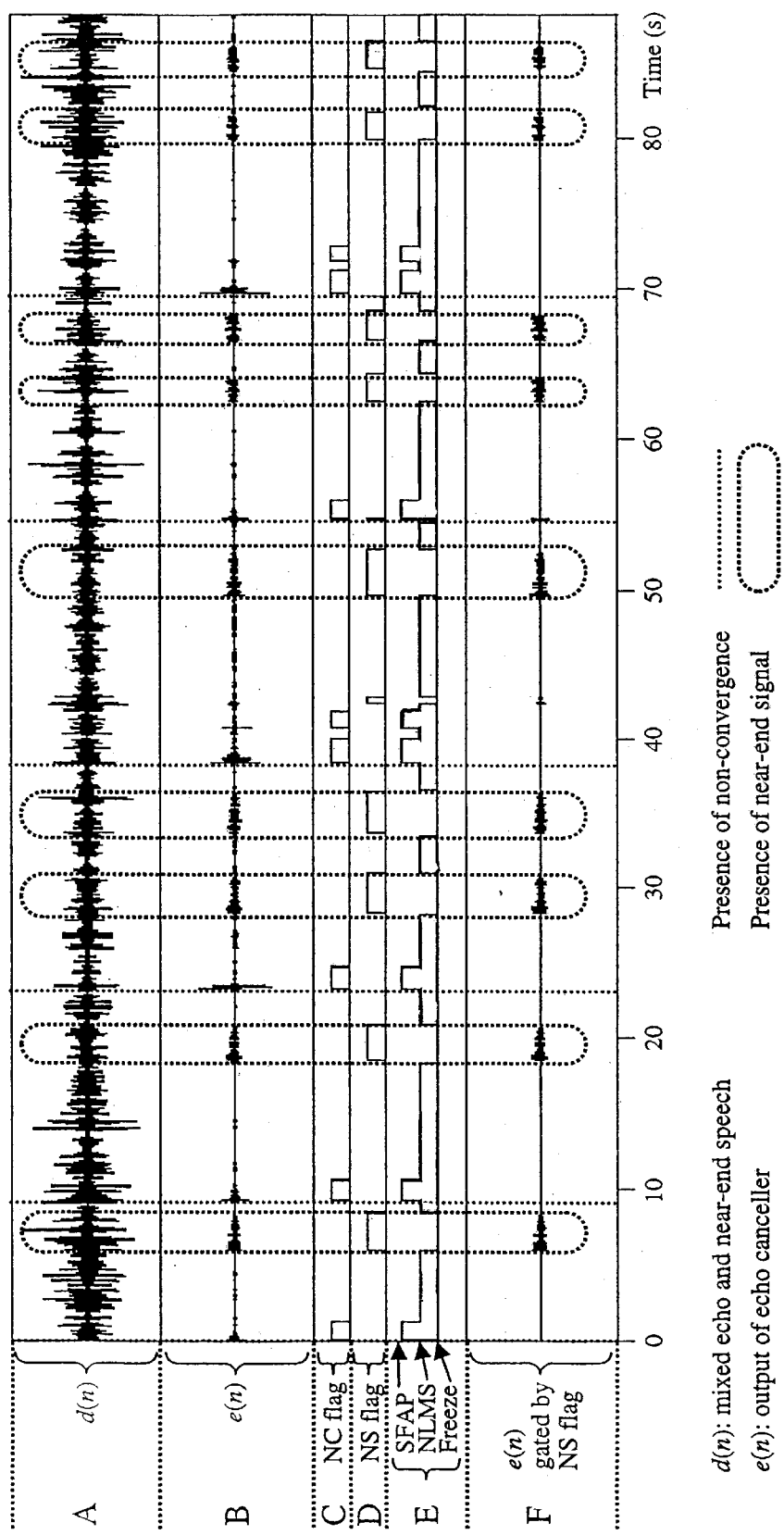
FIG. 5 is a time diagram of the simulation results illustrating operation of the tri-mode filter of FIG. 2.

Each vertical dotted line (roughly corresponding to time instants 0, 9, 23, 38, 54, and 69 s) in FIG. 5 points at an instant where a substantial echo path change takes place, and it can be seen that the amplitude of e(n) increases correspondingly. The diagram shows that immediately after each echo path change the NC flag is correctly generated (NC=1), and the adaptive filter is switched in the SFAP mode of operation. Alternatively, time intervals of the filter operation circled by dotted lovals on the diagram correspond to the presence of substantial near-end signal activities. Accordingly, the NS flag is correctly generated (NS=1) when there is a near-end signal, and the filter is switched in the freezing mode of operation. When none of the NC and NS flags is generated, the filter operates in NLMS mode as per the model of the tri-mode filter operation described above. FIG. 5 also shows that the NS flag is raised briefly at approximately 42 s and 54 s while there is no valid near-end signal present. The probability of such false claims can be nullified or minimized by fine-tuning the thresholds in the quality detector in each specific design.

Thus, under non-convergence and presence of the near-end signal, the prototype can switch between the three modes correctly, possessing both properties of fast convergence and no mis-convergence during the presence of the near-end signal. In terms of residue echo level and full-duplexness, the prototype performs better than any of the known peer products, such as Venture and i2004, which all use NLMS as the adaptation algorithm.

Thus, a tri-mode adaptive filter and method have been provided.

While tri-mode filter and method of the embodiment of the invention have been implemented by using CGFAP and NLMS as fast and slow converging sub-filters (modes) respectively, it is contemplated that other known adaptive filtering methods which provide similar functionality can be used instead of the that of the embodiments of the invention. For example, the CGFAP filter can be replaced with the steepest descent filter comprising a steepest descent calculator operating in accordance with the steepest descent iterative method.

Although the tri-mode filter and method operate with real value numbers, it does not prevent the invention from being extended to cases where introduction of complex numbers is necessary.

Although the embodiment is illustrated within the context of echo cancellation, the results are also applicable to other adaptive filtering applications.

The tri-mode adaptive filter 100 and method of its operation have an advantage over known adaptive filters and methods by providing high quality performance under all conditions which is achieved due to dynamic switching between the modes of operation of the filter.

Thus, it will be appreciated that, while specific embodiments of the invention are described in detail above, numerous variations, combinations and modifications of these embodiments fall within the scope of the invention as defined in the following claims.

What is claimed is:

1. A method of adaptive filtering, comprising the steps of:
providing operation of an adaptive filter in one of three modes, the modes being a fast converging mode, a slow converging mode and a freezing mode;
measuring non-convergence of the filter and a near-end signal, and generating a feedback signal based on the measurements; and
switching between the modes of operation of the filter in response to the feedback signal.

2. A method as defined in claim 1, wherein the step of measuring non-convergence and near-end signal comprises comparing the measured values with pre-determined threshold values.

3. A method as defined in claim 2, wherein the step of switching between the modes of operation of the filter comprises providing operation of the adaptive filter in the freezing mode when the near-end signal is above the corresponding threshold value and non-convergence is below the corresponding threshold value.

4. A method as defined in claim 2, wherein the step of switching between the modes of operation of the filter comprises providing operation of the adaptive filter in the fast converging mode when non-convergence is above a corresponding threshold value and the near-end signal is below a corresponding threshold value.

5. A method as defined in claim 2, wherein the step of switching between the modes of operation of the filter comprises providing operation of the adaptive filter in the slow converging mode when non-convergence and near-end signal are both below corresponding threshold values.

6. A method as defined in claim 2, wherein the step of switching between the modes of operation of the filter comprises providing operation of the adaptive filter in the fast converging mode when non-convergence and near-end signal are both above corresponding threshold values.

7. A method as defined in claim 2, wherein the step of switching between the mode of operation of the filter comprises providing operation of the adaptive filter in the slow converging mode when non-convergence and near-end signal are both above corresponding threshold values.

8. A method as defined in claim 2, wherein the step of switching between the modes of operation of the filter comprises providing operation of the adaptive filter in the freezing mode when non-convergence and near-end signal are both above corresponding threshold values.

9. A method as defined in claims 1 to 8, wherein the step of providing operation of the filter in the slow converging mode comprises providing adaptive filtering in accordance with a normalized least mean square (NLMS) method.

10. A method as defined in claims 1 to 8, wherein the step of providing operation of the filter in the fast converging mode comprises providing adaptive filtering in accordance with a fast affine projection (FAP) method.

11. A method as defined in claims 1 to 8, wherein the step of providing operation of the filter in the fast converging mode comprises providing adaptive filtering in accordance with a stable fast affine projection (SFAP) method.

12. A method as defined in claim 11, wherein the adaptive filtering in accordance with the SFAP method comprises using a steepest descent method.

13. A method as defined in claim 11, wherein the adaptive filtering in accordance with the SFAP method comprises using a conjugate gradient method.

14. A method of adaptive filtering, comprising the steps of:
(a) providing initial adaptive filtering for an incoming signal, by one of a fast convering mode, a slow converging mode and a freezing mode;
(b) measuring non-convergence and a near-end signal;
(c) comparing the measured values of non-convergence and near-end signal with pre-determined threshold values;
(d) when the near-end signal is above the corresponding threshold value and the non-convergence is below the corresponding threshold value, freezing coefficients in the currently used adaptive filtering mode;
(e) when non-convergence is above the corresponding threshold value and the near-end signal is below the corresponding threshold value, providing adaptive filtering in accordance with a fast converging adaptive filtering mode;
(f) when non-convergence and near-end signal are both below the corresponding threshold values, providing adaptive filtering in accordance with a slow converging adaptive filtering mode; and
(g) repeating steps (b) to (f).

15. A method as defined in claim 14, comprising the additional step of providing adaptive filtering in accordance with a fast converging mode when non-convergence and near-end signal are both above the corresponding threshold values, the step being performed before the step (g).

16. A method as defined in claim 14, comprising the additional step of providing adaptive filtering in accordance with a slow converging mode when non-convergence and near-end signal are both above the corresponding threshold values, the step being performed before the step (g).

17. A method as defined in claim 14, comprising the additional step of freezing coefficients in the currently used adaptive filtering mode when non-convergence and near-end signal are both above the corresponding threshold values, the step being performed before the step (g).

18. A method as defined in claims 14 to 17 wherein the step of providing adaptive filtering in accordance with the slow converging adaptive filtering mode comprises providing adaptive filtering in accordance with a normalized least mean square (NLS) method.

19. A method as defined in claims 14 to 17 wherein the step of providing adaptive filtering in accordance with the fast converging adaptive filtering mode comprises providing adaptive filtering in accordance with a fast affine projection (FAP) method.

20. A method as defined in claims 14 to 17 wherein the step of providing adaptive filtering in accordance with the fast converging adaptive filtering mode comprises providing adaptive filtering in accordance with a stable fast affine projection (SFAP) method.

21. A method as defined in claim 20 wherein the adaptive filtering in accordance with the SFAP method comprises using a steepest descent method.

22. A method as defined in claim 20 wherein the adaptive filtering in accordance with the SFAP method comprises using a conjugate gradient method.

23. An adaptive filter, comprising:
   means for providing operation of the adaptive filter in one of the three modes, the modes including fast converging mode, slow converging mode, and a freezing mode;
   means for measuring non-convergence of the filter and a near-end signal, and generating a feedback signal; and
   means for switching between the modes of operation of the filter in response to the feedback signal.

24. An adaptive filter as defined in claim 23, wherein the means for providing operation of the adaptive filter in one of the three modes comprises first, second and third sub-filters which operate in fast converging mode, slow converging mode and freezing mode respectively.

25. An adaptive filter as defined in claim 24, wherein the first sub filter comprises a fast affine projection (FAP) filter.

26. An adaptive filter as defined in claim 24, wherein the first sub-filter comprises a stable fast affine projection (SFAP) filter.

27. An adaptive filter as defined in claim 26, wherein the SFAP filter comprises a steepest descent calculator.

28. An adaptive filter as defined in claim 26, wherein the SFAP filter comprises a conjugate gradient calculator.

29. An adaptive filter as defined in claim 24, wherein the second sub-filter comprises a normalized least mean square (NLMS) filter.

30. An adaptive filter as defined in claim 24, wherein the third sub-filter comprises a filter which operates without updating the filter coefficients, thereby providing convolution only.

31. An adaptive filter as defined in claim 23, wherein the means for measuring non-convergence and near-end signal comprises means for comparing measured values with pre-determined threshold values.

32. An adaptive filter according to claim 23 wherein the means for measuring non-convergence and near end signal comprises a quality detector which identifies presence of non-convergence (NC) and near end signal (NS), distinguishes between them, and compares the measured values with pre-determined threshold values, NC threshold and NS threshold, respectively, to generate the feedback signal.

33. An adaptive filter, comprising:
   first, second and third sub-filters, operable respectively in a fast convergence mode, a slow convergence mode, and a freezing mode;
   a quality detector for measuring non-convergence and a near end signal, comparing the non-convergence to a non-convergence threshold value and comparing the near end signal to a near end signal threshold value, and generating a feedback signal;
   a switching means responsive to the feedback signal to provide switching between sub-filters;
   when the non-convergence is above the corresponding threshold value and the near end signal is below the corresponding threshold value, switching to the fast converging mode;
   when the near end signal is above the corresponding threshold value and the non convergence is below the corresponding threshold value switching to the freezing mode;
   when the non-convergence and near end signal are both below the corresponding threshold values, switching to the slow converging mode; and when both the non-convergence and the near end signal are above the corresponding threshold values, operating the filter in any one of the sub-filters modes according to system requirements.

* * * * *